United States Patent
Huang

(10) Patent No.: US 11,183,244 B2
(45) Date of Patent: Nov. 23, 2021

(54) MEMORY DEVICE AND CONTROL METHOD THEREOF

(71) Applicant: WINBOND ELECTRONICS CORP., Taichung (TW)

(72) Inventor: Chung-Meng Huang, Hsinchu (TW)

(73) Assignee: WINBOND ELECTRONICS CORP., Taichung (TW)

( * ) Notice: Subject to any disclaimer, the term of this patent is extended or adjusted under 35 U.S.C. 154(b) by 191 days.

(21) Appl. No.: 16/558,747

(22) Filed: Sep. 3, 2019

(65) Prior Publication Data

US 2021/0065804 A1   Mar. 4, 2021

(51) Int. Cl.
*G11C 16/08*   (2006.01)
*G11C 16/26*   (2006.01)
*G11C 16/30*   (2006.01)
*G11C 16/32*   (2006.01)

(52) U.S. Cl.
CPC .............. *G11C 16/08* (2013.01); *G11C 16/26* (2013.01); *G11C 16/30* (2013.01); *G11C 16/32* (2013.01)

(58) Field of Classification Search
CPC ......... G11C 16/08; G11C 16/26; G11C 16/30; G11C 16/32; G11C 7/06
See application file for complete search history.

(56) References Cited

U.S. PATENT DOCUMENTS

| 5,941,990 A * | 8/1999 | Hiiragizawa | G11C 16/30 713/310 |
| 7,724,071 B2 * | 5/2010 | Okada | G11C 16/30 327/536 |
| 2004/0103330 A1 | 5/2004 | Bonnett | |
| 2006/0245260 A1 | 11/2006 | Kim | |
| 2010/0246282 A1 * | 9/2010 | Racape | G11C 5/145 365/189.09 |
| 2020/0411104 A1 * | 12/2020 | Shin | G11C 16/30 |

FOREIGN PATENT DOCUMENTS

TW   201545162 A   12/2015

OTHER PUBLICATIONS

Office Action issued in corresponding TW application No. 108123079 dated May 20, 2020.
Search Report issued in corresponding TW application No. 108123679 dated May 20, 2020.

* cited by examiner

*Primary Examiner* — Mohammed A Bashar
(74) *Attorney, Agent, or Firm* — Muncy, Geissler, Olds & Lowe, P.C.

(57) ABSTRACT

A memory device includes a memory array and a frequency-to-voltage converter. The memory array includes a plurality of memory cells arranged in rows and columns, and gates of the memory cells in the same row are coupled to each other and connected to a word line. The frequency-to-voltage converter coupled between the word line and a clock signal source outside the memory device receives a clock signal, and correspondingly outputs different voltages to the word line in accordance with the frequency of the clock signal.

13 Claims, 4 Drawing Sheets

MEMORY DEVICE AND CONTROL METHOD THEREOF

FIELD OF THE INVENTION

The invention relates in general to a memory device, and it relates in particular to a word line voltage adjustable memory device and the control method thereof.

DESCRIPTION OF THE RELATED ART

Data stored in the serial peripheral interface (SPI) flash memory can be read out synchronously through a serial clock. As shown in FIG. 1, when a memory cell 104 in the memory 100 needs to be read, a voltage on a word line 106 is set to a high voltage level, and the memory cell 104 is turned on to generate a memory cell current (I_cell) which flows through a load 1 to produce a voltage V1 at a node a. At the same time, a reference current (I_ref) flows through a load 2 to produce a voltage V2 at a node b. The magnitude of the voltage V1 and the voltage V2 is compared by a sense amplifier 108 to determine whether a bit stored in the memory cell 104 is a logic high level or a logic low level.

Generally, the reading of the SPI flash memory needs to be synchronized with the serial clock. When the frequency of the serial clock increases, the sensing rate of the sense amplifier 108 also needs to increase synchronously.

The sensing rate of the sense amplifier 108 depends on the memory cell current I_cell. The larger the memory cell current I_cell is, the faster the detection speed of the sense amplifier 108 is. The magnitude of the memory cell I_cell current depends on the voltage of the word line 106. The higher the voltage of the word line 106 is, the larger the memory cell current I_cell is. In other words, the higher the voltage of the word line 106 is, the faster the detection speed of the sense amplifier 108 is. A bit detection unit 110 receives an output signal from the sense amplifier 108 to final determine whether a bit stored in the memory cell 104 is a logic high level or a logic low level.

However, the larger the memory cell current I_cell is, the larger the total current consumption of the memory 100 is, which is disadvantageously applicable to the trend of low energy consumption of the memory.

BRIEF SUMMARY OF THE INVENTION

In order to resolve the problem described above, the present invention discloses a memory device including a memory array and a frequency-to-voltage converter. The memory array includes of a plurality of memory cells arranged in rows and columns, and gates of the memory cells in the same row are coupled to each other and connected to a word line. The frequency-to-voltage converter connects the word line to a clock signal source outside the memory device. The frequency-to-voltage converter receives a clock signal and correspondingly outputs different voltages to the word line in accordance with the frequency of the clock signal.

The present invention also discloses a control method of a memory device. The memory device includes a memory array and a frequency-to-voltage converter. The memory array includes of a plurality of memory cells arranged in rows and columns, and gates of the memory cells in the same row are coupled to each other and connected to a word line. The frequency-to-voltage converter connects the word line to a clock signal source outside the memory device. The control method includes the following steps: the clock signal source outside the memory device provides a clock signal; the memory device reads data stored in the plurality of memory cells; the frequency-to-voltage converter receives the clock signal, and the frequency-to-voltage converter correspondingly outputs different voltages to the word line in accordance with the frequency of the clock signal.

According to the present invention, when the frequency of the clock signal is low, the voltage of the word line can be reduced correspondingly, thereby the memory current of the memory and the detection speed of the sense amplifier are reduced in order to reduce power consumption due to the low frequency of the serial clock.

BRIEF DESCRIPTION OF THE DRAWINGS

The invention can be more fully understood by reading the subsequent detailed description with references made to the accompanying figures. It should be understood that the figures are not drawn to scale in accordance with standard practice in the industry. In fact, it is allowed to arbitrarily enlarge or reduce the size of components for clear illustration.

DETAILED DESCRIPTION OF THE INVENTION

Figure 1:
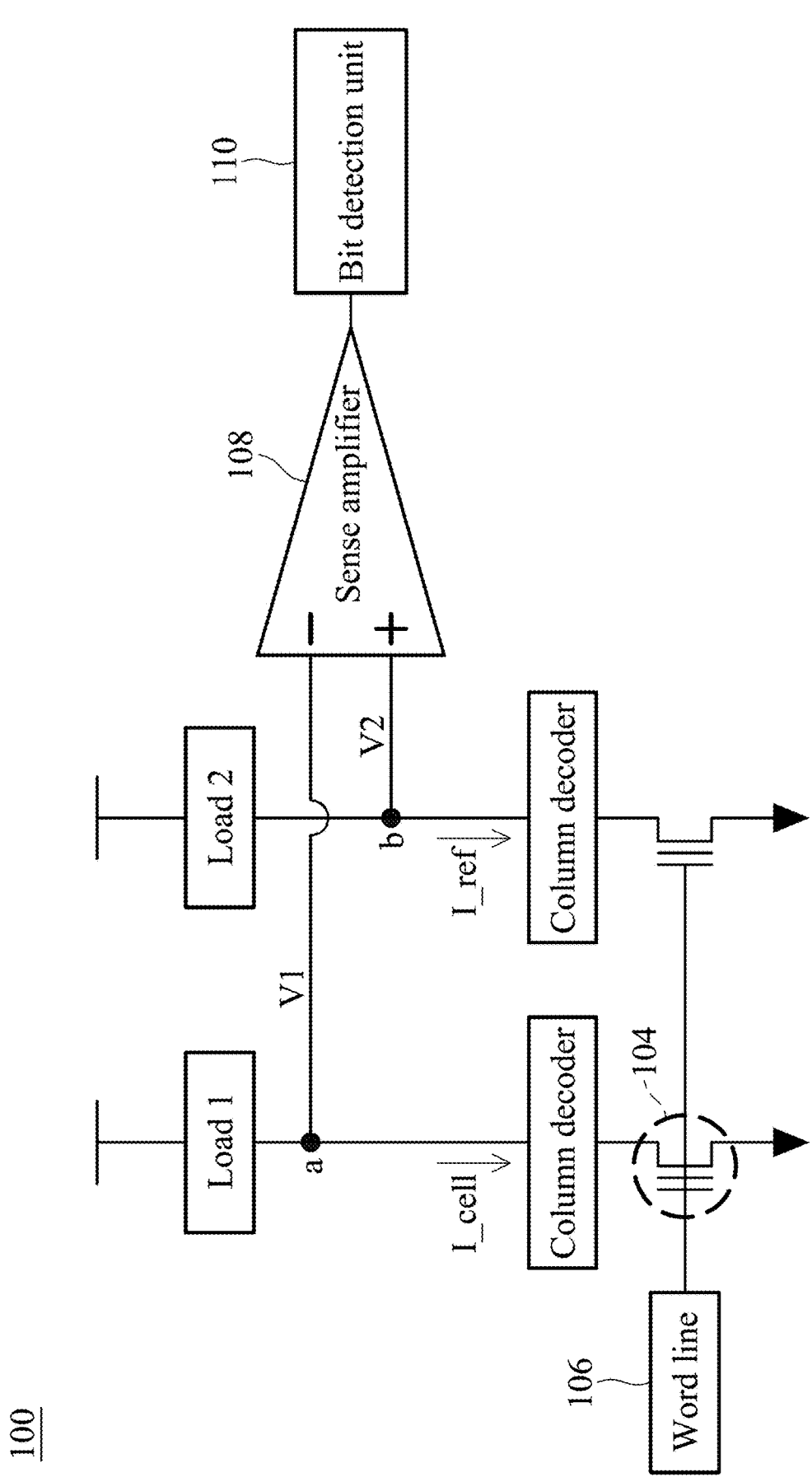
FIG. 1 is a schematic diagram of a memory.
Figure 2:
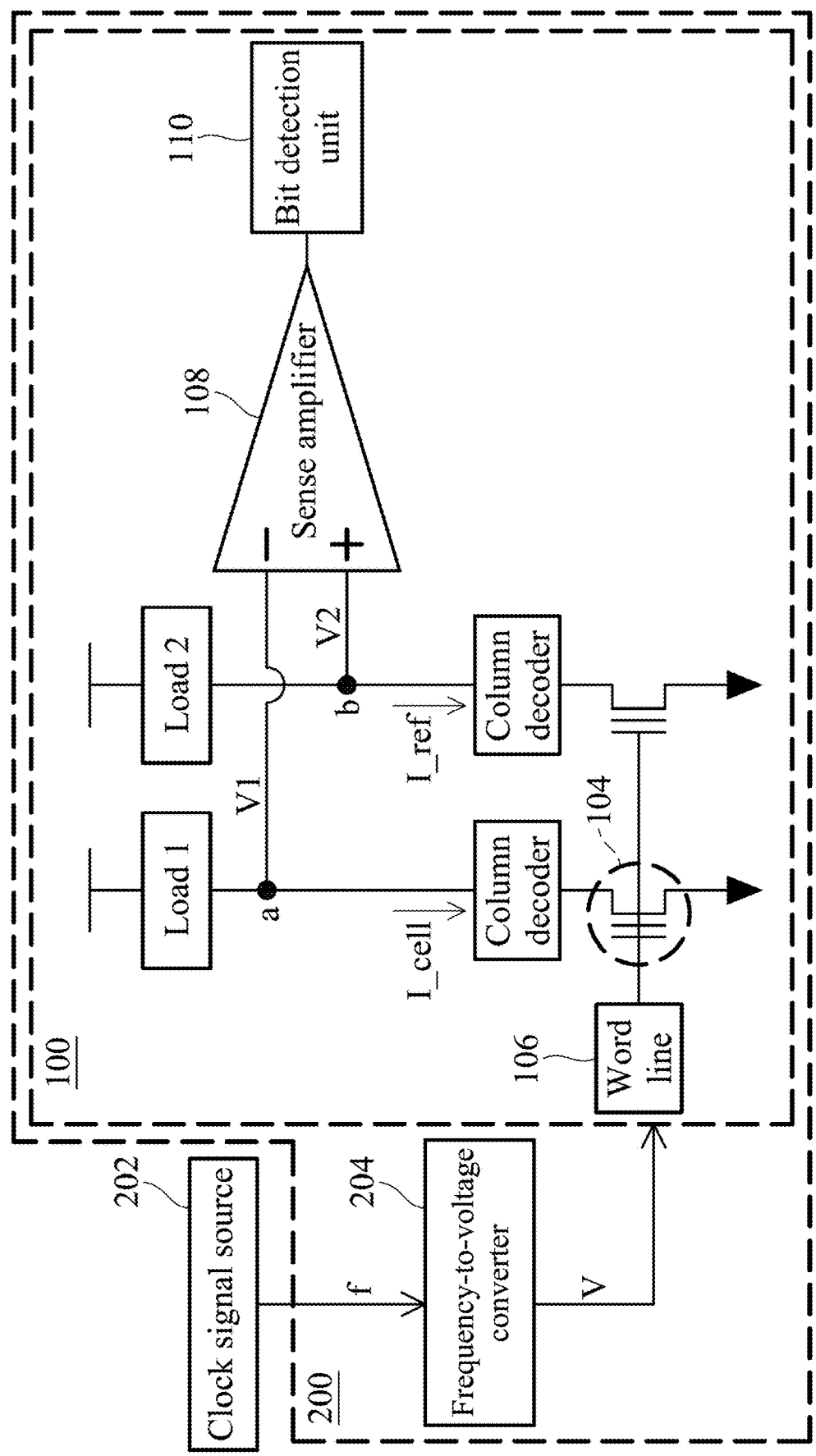
FIG. 2 is a block diagram of a memory device in accordance with an embodiment of the disclosure.

Refer to FIG. 2, a memory device 200 includes a frequency-to-voltage converter 204 and the memory device 100 in FIG. 1. A clock signal source 202 provides a clock signal (f) to the frequency-to-voltage converter 204. In some embodiments, the clock signal source 202 can be a quartz crystal resonator (Xtal) in a system (which is outside the memory device 200), wherein the quartz crystal resonator may include a register, and when the values written into the register are not the same, the quartz crystal resonator may output clock signals of different frequencies. For example, when the value of the register is "01", the quartz crystal resonator outputs a clock signal of 40 MHz; when the value of the register is "10", the quartz crystal resonator outputs a clock signal of 80 MHz. The values and the amount of data stored in the register described above, and the frequency of the clock signal output by the quartz crystal resonator are merely examples, and the present invention is not limit thereto.

The frequency-to-voltage converter 204 connects the word line 106 to the clock signal source 202. The frequency-to-voltage converter 204 receives the clock signal OD, and correspondingly outputs different voltages (V) to the word line 106 in accordance with the frequency of the clock signal. The word line 106 may correspond to any of the rows in a memory array in the memory device 200. A row decoder and a column decoder in the memory device 200 specify a specific memory cell that corresponds to a specific row and a specific column according to the read address in a received read command, and adjust the word line corresponding to the specific memory cell to a high voltage level, so that the memory device 200 can read a bit stored in the specific memory cell (for example, the memory cell 104).

Figure 3:
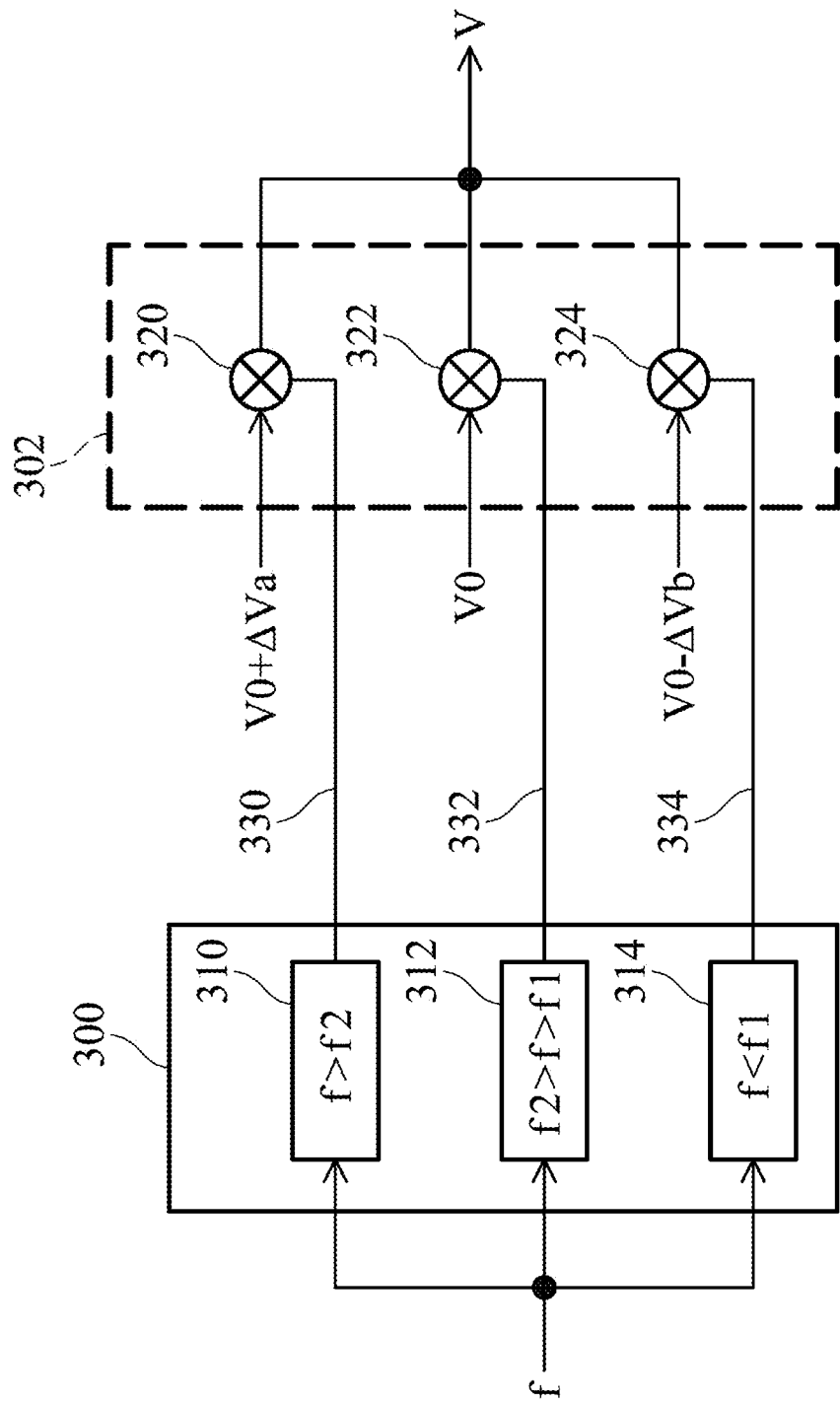
FIG. 3 is a block diagram of a frequency-to-voltage converter in accordance with the embodiment of the disclosure.

Refer to FIG. 3, the frequency-to-voltage converter 204 includes a frequency detector 300 and a voltage regulator 302. The frequency detector 300 receives the clock signal (f), determines the frequency segment that the clock signal (f) belongs to, and outputs a frequency discrimination result to the voltage regulator 302 in accordance with the frequency segment. For example, frequency detector 300 includes a plurality of frequency judgment units, such as frequency judgment units 310, 312, and 314. The frequency judgment units 310, 312, and 314 respectively determine different frequency segments, and output frequency discrimination results in accordance with determined frequency segments.

In some embodiments, the frequency judgment unit 310 is used to determine whether the frequency of the clock signal (f) is higher than a second frequency (f2). If the frequency of the clock signal (f) is higher than the second frequency (f2), the frequency judgment unit 310 outputs a logic high level ("1") to the voltage regulator 302. At the same time, because the frequency of the clock signal (f) does not fall within the frequency segments of the frequency judgment units 312 and 314. That is, the frequency of the clock signal (f) does not fall between a first frequency (f1) and the second frequency (f2). The frequency of the clock signal (f) is not less than the first frequency (f1). The frequency judgment units 312 and 314 output a logic low level ("0") to the voltage regulator 302. At this time, the frequency discrimination result output by the frequency detector 300 is (1, 0, 0), wherein "1" is output by the frequency judgment unit 310, and "0" is output by the frequency judgment units 312 and 314. That is, at this time, control signal 330 is "1", control signal 332 is "0" and control signal 334 is "0". In some embodiments, the first frequency is (f1) is 50 MHz, and the second frequency (f2) is 104 MHz.

In some embodiments, the frequency judgment units 310, 312, and 314 can respectively include a phase frequency detector (PFD) and a logic circuit (not shown). A person skilled in the art can understand that the phase frequency detector can reflect the phase sequence and the frequency of two different signals input to the phase frequency detector by outputting an UP signal and a DN signal. In some embodiments, the phase frequency detector in the frequency judgment 310 receives the clock signal (f) and another clock signal with the second frequency (f2), when the frequency of the clock signal (f) is higher than the second frequency (f2), the UP signal output by the phase frequency detector is logic high level, and the DN signal is logic low level. After receiving a result of (UP, DN)=(1, 0), the logic circuit, coupled after the phase frequency detector, outputs "1" at its output end, that is, the control signal 330 is "1". In contrast, the logic circuit outputs "0" at its output end, that is, the control signal 330 is "0".

In some embodiments, the voltage regulator 302 includes three switches, which are switch 320, switch 322, and switch 324. The switch 320 determines whether a voltage (V0+ΔVa) should be output to the word line 106 in accordance with the control signal 330. The switch 322 determines whether a voltage (V0) should be output to the word line 106 in accordance with the control signal 332. The switch 324 determines whether a voltage (V0−ΔVb) should be output to the word line 106 in accordance with the control signal 334. In some embodiments, the voltage (V0) is 5.75V, the voltage (V0+ΔVa) is 6V, and the voltage (V0−ΔVb) is 5.5V. That is, the voltage (ΔVa and ΔVb) is 0.25V. The voltage values stated above are merely examples, and these voltage values are acceptable as long as the input voltage of switch 320 is higher than that of switch 322, and the input voltage of switch 322 is higher than that of switch 324.

When the frequency discrimination result output by the frequency detector 300 is (1, 0, 0), switch 320 is turned on according to control signal 330, switch 322 is turned off according to control signal 332, and switch 324 is turned off according to control signal 334, thus the voltage regulator 302 outputs the voltage (V0+ΔVa) to the word line. That is, V=V0+ΔVa. When the frequency discrimination result output by the frequency detector 300 is (0, 0, 1), switch 320 is turned off according to control signal 330, switch 322 is turned off according to control signal 332, and switch 324 is turned on according to control signal 334, thus the voltage regulator 302 outputs the voltage (V0−ΔVb) to the word line. That is, V=V0−ΔVb.

Figure 4:
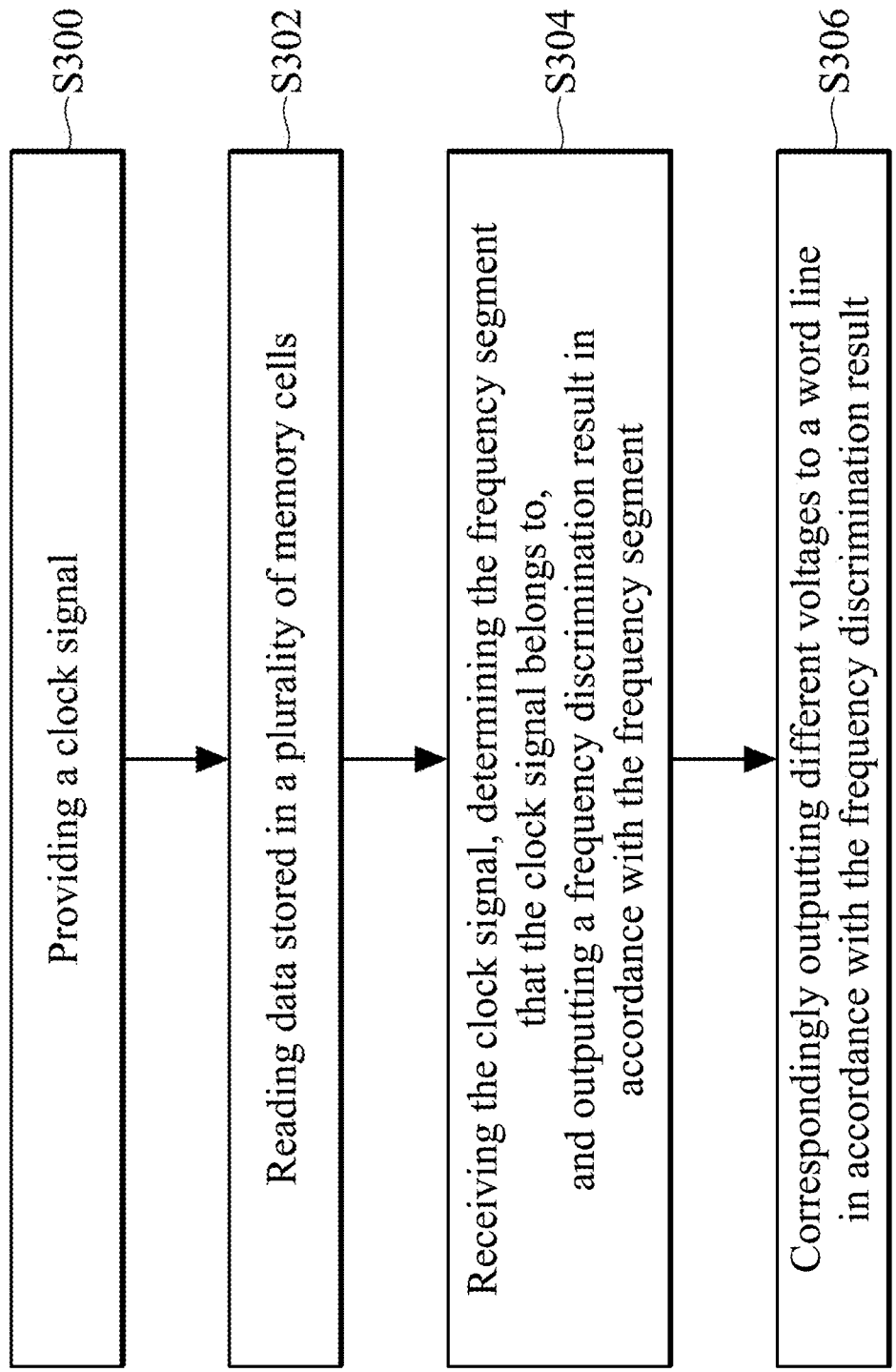
FIG. 4 is a flow chart of the memory device control method in accordance with the embodiment of the disclosure.

FIG. 4 is a flow chart of the memory device 200 control method in accordance with the embodiment of the disclosure. The memory device 200 control method, for example, can be a reading method for an SPI flash. As shown in FIG. 4, the clock signal source 202 provides a clock signal (f) (S300), wherein the clock signal source 202 is arranged outside the memory device 200, and the clock signal (f) can be an SPI serial clock. When the memory device 200 reads data stored in a plurality of memory cells therein (S302), the frequency detector 300 receives the clock signal (f), determines the frequency segment that the clock signal (f) belongs to, and outputs a frequency discrimination result in accordance with the frequency segment (S304). The voltage regulator 302 correspondingly outputs different voltages to a word line 106 in the memory device 200 in accordance with the frequency discrimination result (S306). In some embodiments, the step S306 includes the following three cases. (I) When the frequency detector 300 determines that the frequency of the clock signal (f) is less than the first frequency (f1), the frequency detector 300 outputs a control signal 334 to the voltage regulator 302, so that the voltage regulator 302 outputs a voltage (V0−ΔVb). (II) When the frequency detector 300 determines that the frequency of the clock signal (f) is higher than the first frequency, but is less than a second frequency (f2), the frequency detector 300 outputs a control signal 332 to the voltage regulator 302, so that the voltage regulator 302 outputs a voltage (V0). (III) When the frequency detector 300 determines that the frequency of the clock signal (t is higher than the second frequency (f2), the frequency detector 300 outputs a control signal 330 to the voltage regulator 302, so that the voltage regulator 302 outputs a voltage (V0+ΔVa).

The memory device and the control method thereof in accordance with embodiments of the disclosure of the present invention can adjust the voltage on a word line in the memory device according to the frequency of an input clock signal of the memory. The present invention can increase the memory cell current I_cell by increasing the voltage on the word line, so that the reading speed of the memory is increased. In contrast, the present invention can also decrease the memory cell current I_cell by decreasing the voltage on the word line, so that the reading speed of the memory is decreased. Therefore, under high-frequency clock input, by increasing the voltage on the word line, the reading speed of the memory can be increased, and the reading speed can be synchronized with the high-frequency clock input. Under low-frequency clock input, by decreasing the voltage on the word line, the total power consumption of the memory can be decreased to save power.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term). In the specification of the present invention, the word "couple" refers to any kind of direct or indirect electronic connection. The present invention is disclosed in the preferred embodiments as described above, however, the breadth and scope of the present invention should not be limited by any of the embodiments described above. Persons skilled in the art can make small changes and retouches without departing from the spirit and scope of the invention. The scope of the invention should be defined in accordance with the following claims and their equivalents.

What is claimed is:

1. A memory device, comprising:
    a memory array, having a plurality of memory cells arranged in rows and columns; wherein gates of the memory cells in the same row are coupled to each other and connected to a word line;
    a frequency-to-voltage converter, coupled between the word line and a clock signal source outside the memory device, receiving a clock signal and correspondingly outputting different voltages to the word line in accordance with a frequency of the clock signal;
    wherein the frequency-to-voltage converter comprises a frequency detector, the frequency detector receives the clock signal, determines a frequency segment that the clock signal belongs to by comparing the frequency of the clock signal with predetermined frequencies, and outputs a frequency discrimination result in accordance with the frequency segment.

2. The memory device as claimed in claim 1, wherein the frequency-to-voltage converter further comprises:
    a voltage regulator, correspondingly outputting the different voltages to the word line in accordance with the frequency discrimination result;
    wherein the higher the frequency of the clock signal, the higher the voltage that the frequency-to-voltage converter outputs to the word line.

3. The memory device as claimed in claim 2, wherein the frequency detector comprises a plurality of frequency judgment units, each frequency judgment unit respectively determines different frequency segments, and outputs the frequency discrimination result in accordance with a determined frequency segment.

4. The memory device as claimed in claim 2, wherein the frequency detector outputs the frequency discrimination result in accordance with the frequency segment, comprising:
    when the frequency detector determines that the frequency of the clock signal is less than a first frequency, the frequency detector outputs a first enable signal to the voltage regulator;
    when the frequency detector determines that the frequency of the clock signal is higher than the first frequency but less than a second frequency, the frequency detector outputs a second enable signal to the voltage regulator;
    when the frequency detector determines that the frequency of the clock signal is higher than the second frequency, the frequency detector outputs a third enable signal to the voltage regulator;
    wherein the second frequency is higher than the first frequency.

5. The memory device as claimed in claim 4, wherein when the voltage regulator receives the first enable signal, the voltage regulator outputs a first voltage to the word line; when the voltage regulator receives the second enable signal, the voltage regulator outputs a second voltage to the word line; when the voltage regulator receives the third enable signal, the voltage regulator outputs a third voltage to the word line; wherein the third voltage is higher than the second voltage, and the second voltage is higher than the first voltage.

6. The memory device as claimed in claim 4, wherein a voltage difference between the second voltage and the first voltage is equal to that between the third voltage and the second voltage.

7. The memory device as claimed in claim 3, wherein each frequency judgment unit at least comprises a phase frequency detector.

8. A memory device control method, wherein the memory device comprises a memory array and a frequency-to-voltage converter, the memory array has a plurality of memory cells arranged in rows and columns, and gates of the memory cells in the same row are coupled to each other and connected to a word line; the frequency-to-voltage converter is coupled between the word line and a clock signal source outside the memory device; the control method comprising:
    providing a clock signal by the clock signal source outside the memory source;
    reading data stored in the plurality of memory cells by the memory device;
    receiving the clock signal by the frequency-to-voltage converter, and correspondingly outputting different voltages to the word line by the frequency-to-voltage converter in accordance with the frequency of the clock signal;
    wherein the frequency-to-voltage converter comprises a frequency detector, the frequency detector receives the clock signal, determines a frequency segment that the clock signal belongs to by comparing the frequency of the clock signal with predetermined frequencies, and outputs a frequency discrimination result in accordance with the frequency segment.

9. The memory device control method as claimed in claim 8, wherein the frequency-to-voltage converter further comprises a voltage regulator; the voltage regulator correspondingly outputs different voltages to the word line in accordance with the frequency discrimination result.

10. The memory device control method as claimed in claim 9, wherein the frequency detector comprises a plurality of frequency judgment units, each frequency judgment unit respectively determines different frequency segments, and outputs the frequency discrimination result in accordance with a determined frequency segment.

11. The memory device control method as claimed in claim 9, wherein the frequency detector outputs the frequency discrimination result in accordance with the frequency segment, comprising:
    when the frequency detector determines that the frequency of the clock signal is less than a first frequency, the frequency detector outputs a first enable signal to the voltage regulator;
    when the frequency detector determines that the frequency of the clock signal is higher than the first frequency but less than a second frequency, the frequency detector outputs a second enable signal to the voltage regulator;
    when the frequency detector determines that the frequency of the clock signal is higher than the second frequency, the frequency detector outputs a third enable signal to the voltage regulator.

12. The memory device control method as claimed in claim 11, wherein the second frequency is higher than the first frequency;

when the voltage regulator receives the first enable signal, the voltage regulator outputs a first voltage to the word line; when the voltage regulator receives the second enable signal, the voltage regulator outputs a second voltage to the word line; when the voltage regulator receives the third enable signal, the voltage regulator outputs a third voltage to the word line; wherein the third voltage is higher than the second voltage, and the second voltage is higher than the first voltage.

13. The memory device control method as claimed in claim 11, wherein a voltage difference between the second voltage and the first voltage is equal to that between the third voltage and the second voltage.

\* \* \* \* \*